United States Patent
Wu et al.

(10) Patent No.: US 9,720,149 B2
(45) Date of Patent: Aug. 1, 2017

(54) DISPLAY DEVICE WITH COLOR CONVERSION LAYER FOR FULL-COLOR DISPLAY

(71) Applicant: Ye Xin Technology Consulting Co., Ltd., Hsinchu (TW)

(72) Inventors: I-Wei Wu, Hsinchu (TW); Yung-Fu Lin, Hsinchu (TW); Chang-Ting Lin, Hsinchu (TW); Shih-Pin Tseng, Hsinchu (TW); Pen-Chu Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 171 days.

(21) Appl. No.: 14/582,620

(22) Filed: Dec. 24, 2014

(65) Prior Publication Data

US 2015/0185381 A1    Jul. 2, 2015

(30) Foreign Application Priority Data

Dec. 26, 2013    (TW) .............................. 102148432 A

(51) Int. Cl.
| | |
|---|---|
| *G02B 5/20* | (2006.01) |
| *H01L 27/32* | (2006.01) |
| *G02F 1/1335* | (2006.01) |
| *B82Y 20/00* | (2011.01) |
| *H01L 51/52* | (2006.01) |

(52) U.S. Cl.
CPC ....... *G02B 5/201* (2013.01); *G02F 1/133617* (2013.01); *H01L 27/322* (2013.01); *B82Y 20/00* (2013.01); *G02F 2202/36* (2013.01); *H01L 51/5284* (2013.01); *Y10S 977/774* (2013.01)

(58) Field of Classification Search
CPC .. G02B 5/201; G02F 1/133617; H01L 27/322
See application file for complete search history.

(56) References Cited

U.S. PATENT DOCUMENTS

| | | | |
|---|---|---|---|
| 2006/0284533 A1 | 12/2006 | Lee | |
| 2010/0079704 A1* | 4/2010 | Cho | ................. G02F 1/133617 349/71 |
| 2011/0248256 A1 | 10/2011 | Cok et al. | |
| 2013/0335799 A1 | 12/2013 | Yoon et al. | |

FOREIGN PATENT DOCUMENTS

| | | |
|---|---|---|
| CN | 101484841 A | 7/2009 |
| CN | 102866535 A | 1/2013 |
| CN | 103227189 A | 7/2013 |
| CN | 203241664 U | 10/2013 |
| CN | 103474451 A | 12/2013 |
| JP | 10-170918 A | 6/1998 |
| JP | 2009-087784 A | 4/2009 |
| JP | 2013-015812 A | 1/2013 |
| JP | 2013-137931 A | 7/2013 |
| TW | 201506459 A | 2/2015 |

* cited by examiner

*Primary Examiner* — Anne Hines
(74) *Attorney, Agent, or Firm* — Steven Reiss

(57) ABSTRACT

A display device with a color conversion layer providing predetermined colors for full-color display. The color conversion layer includes a plurality of color conversion units. Each color conversion unit includes a quantum dot film. The color conversion unit is configured to receive light beams and converts the light beams to primary colors to emit. Each color conversion unit defines a plurality of areas, and each primary color corresponds to one of the areas of the color conversion unit.

20 Claims, 8 Drawing Sheets

DISPLAY DEVICE WITH COLOR CONVERSION LAYER FOR FULL-COLOR DISPLAY

FIELD

The subject matter herein generally relates to a color conversion layer, and more particularly, to an organic light-emitting diode display panel with a color conversion layer and a liquid crystal display panel with a color conversion layer.

BACKGROUND

Organic light-emitting diode (OLED) display technology has recently attracted many researches and developments in the field of emissive displays. The particular color emitted by one OLED cell depends on the type of organic material incorporated therein. In a multicolor electroluminescent display, the pixel structure therefore is generally configured to include a plurality of OLED of different basic color emissions. In operation, these color lights are mixed to provide a full spectrum of display colors.

One major technical issue encountered in the conventional OLED display is its reliability. After a time of service, the screen of the OLED display usually becomes non-uniform due to the difference in the aging rate of each color light-emitting unit. The difference of aging rate is due to a characteristic alteration that varies between different electroluminescent materials, and which affects the performance of the display.

Some technical approaches have been made to remedy this reliability issue. One of the solution known in the art proposes the addition of a feedback control circuit to adjust the electric current flowing through the OLED, and thereby compensate the intrinsic property degradation of the light-emitting unit. However, this approach provides limited results, and still fail to prolong the service life of the organic electroluminescent display.

BRIEF DESCRIPTION OF THE DRAWINGS

Implementations of the present technology will now be described, by way of example only, with reference to the attached figures.

DETAILED DESCRIPTION

Figure 1:
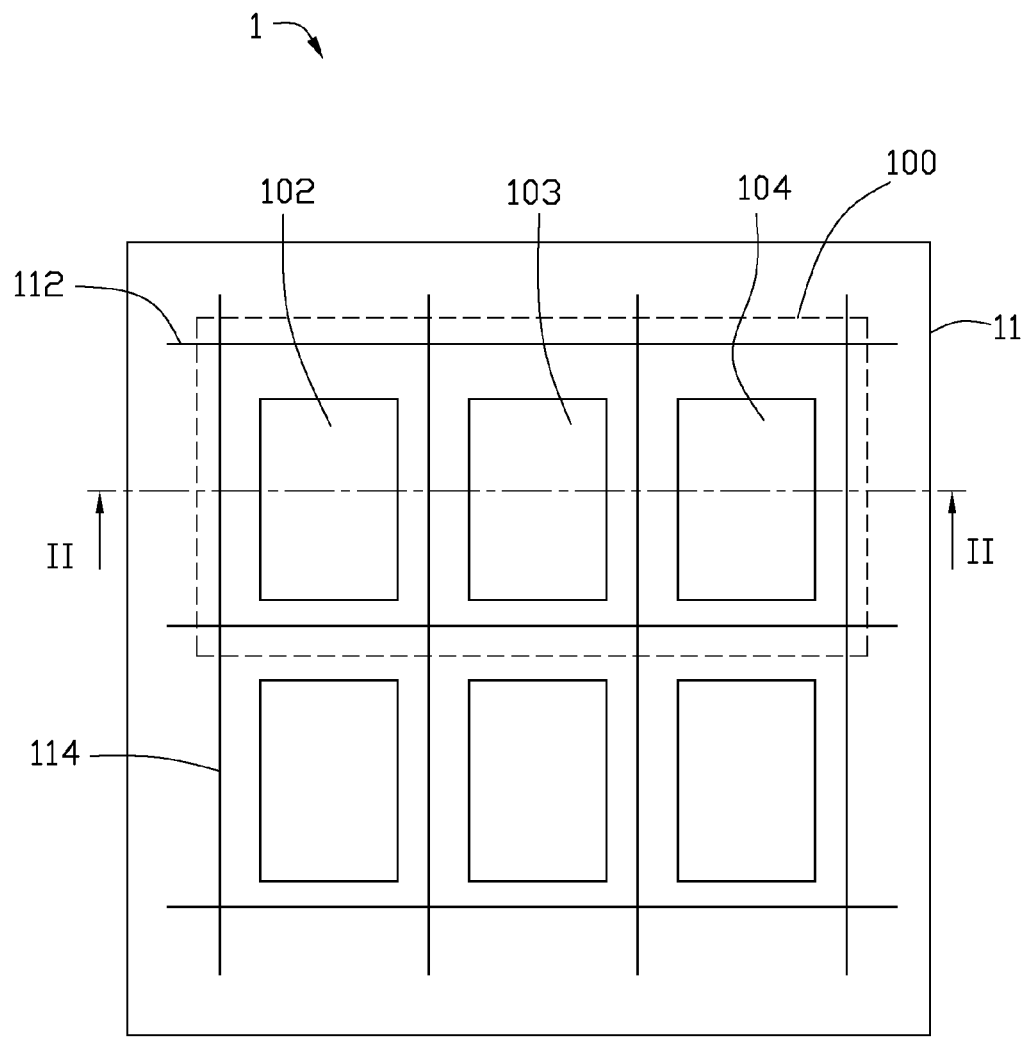
FIG. 1 is a diagrammatic view of a first embodiment of an OLED display panel of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates a diagrammatic view of a first embodiment of an OLED display panel 1 of the present disclosure. The OLED display panel 1 for full-color display includes a plurality of pixels 100. Each of the plurality of pixels 100 includes a first sub-pixel 102, a second sub-pixel 103 and a third sub-pixel 104 for emitting different color light respectively.

The OLED display panel 1 further includes a substrate 11, a plurality of scanning lines 112 parallelly disposed on the substrate, a plurality of data lines 114 parallelly disposed on the substrate and insulately crossing the plurality of scanning lines to define the first sub-pixel 102, second sub-pixel 103 and third sub-pixel 104, and a plurality of first electrodes 131. Each of the plurality of first electrodes 131 corresponds to the first sub-pixel 102, second sub-pixel 103 and third sub-pixel 104 respectively.

Figure 2:
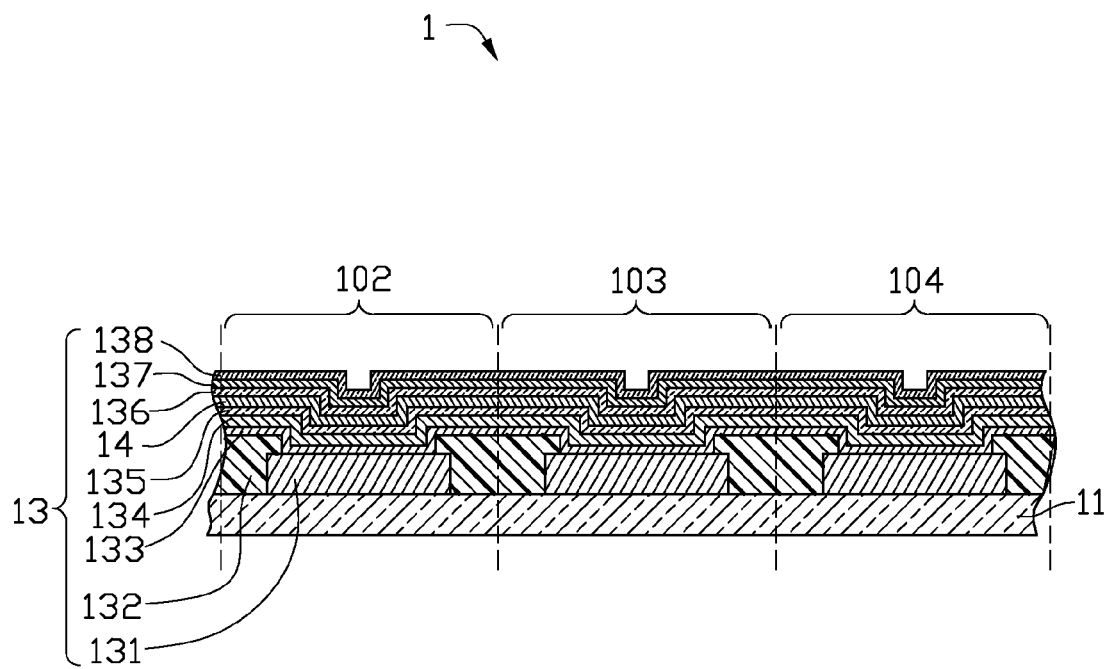
FIG. 2 is a cross-sectional view taken along II-II line of FIG. 1.

FIG. 2 is a cross-sectional view taken along II-II line of FIG. 1. In FIG. 2, the OLED display panel 1 further includes a plurality of insulating films 132, a hole injection layer 133, a hole transporting layer 134, an organic light-emitting layer 135, an electron transporting layer 136, an electron injection layer 137 and a second electrode 138. Each of the plurality of insulating films 132 is formed between each of the plurality of first electrodes 131. The hole injection layer 133, the hole transporting layer 134, the organic light-emitting layer 135, the electron transporting layer 136, the electron injection layer 137 and the second electrode 138 are sequentially deposited over the plurality of insulating films 132 and the plurality of first electrodes 131. Each of the plurality of first electrodes 131, the hole injection layer 133, the hole transporting layer 134, the organic light-emitting layer 135, the electron transporting layer 136, the electron injection layer 137 and the second electrode 138 define an OLED unit 13. Each of the OLED unit 13 corresponds to the first sub-pixel 102, the second sub-pixel 103 and the third sub-pixel 104 respectively. Each of the plurality of first electrodes 131 is an anode of the OLED unit 13. The second electrode 138 is a cathode of the OLED unit 13. In some cases, at least one the hole injection layer 133, the hole transporting layer 134, the electron transporting layer 136 and the electron injection layer 137 can be omitted in the OLED unit 13. When a driving voltage is applied between the first electrode 131 and the second electrode 138 of the OLED unit 13 that the organic light-emitting layer 135 of the OLED unit 13 will be emitting light. In this embodiment, the emitting light of the OLED unit 13 is blue light.

The OLED display panel 1 further includes a color conversion layer 14, the color conversion layer 14 receives the blue light emitting by the OLED unit 13 and converts the blue light to at least one of three-primary colors to emit. The color conversion layer 14 is disposed between the first electrode 131 and the second electrode 138. The color conversion layer 14 can be disposed between any two layers of the first electrode 131, the hole injection layer 133, the hole transporting layer 134, the organic light-emitting layer 135, the electron transporting layer 136, the electron injection layer 137 and the second electrode 138. The color conversion layer 14 can also be disposed on the second electrode 138 away from the first electrode 131. In this embodiment, the color conversion layer 14 is disposed between organic light-emitting layer 135 and the electron transporting layer 136.

The color conversion layer 14 includes a plurality of color conversion units 140, each of the plurality of color conversion units 140 corresponds to one of the plurality of pixels 100.

In this embodiment, the OLED display panel 1 is a three primary colors display model, the three primary colors are red green and blue, the three primary colors red green and blue correspond to the first sub-pixel 102, the second sub-pixel 103 and third sub-pixel 104 respectively.

Figure 3:
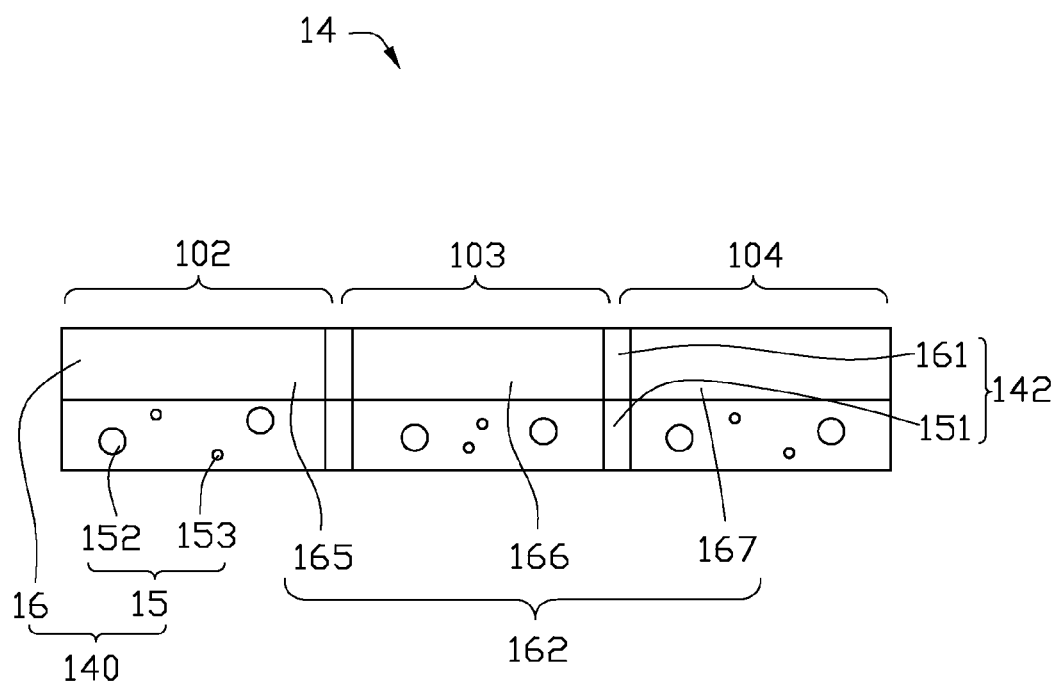
FIG. 3 is a diagrammatic view of a color conversion layer of the OLED display panel.

FIG. 3 illustrates a diagrammatic view of a color conversion layer 14 of the OLED display panel 1. The color conversion layer 14 further includes a shielding layer 142 dividing each of the plurality of color conversion units 140 into the plurality of sub-areas, each of the plurality of sub-areas respectively corresponds to the first sub-pixel 102, the second sub-pixel 103 and the third sub-pixel 104 of the pixel 100 of the OLED display panel 1. Each of the plurality of color conversion units 140 includes a quantum dot film 15 and a color filter layer 16 overlapping the quantum dot film 15, the quantum dot film 15 is set closer to the substrate 11 than the color filter layer 16.

The color filter layer 16 includes a coloration layer 162 and a first black matrix 161, the coloration layer 162 includes a red coloration unit 165, a green coloration unit 166 and a blue coloration unit 167, and the first black matrix 161 is configured to separate the red coloration unit 165, the green coloration unit 166 and the blue coloration unit 167.

The quantum dot film 15 includes a second black matrix 151 corresponding to the first black matrix 161. The second black matrix 151 divides the quantum dot film 15 into a plurality of sub-regions. The first black matrix 161 and second black matrix 151 constitute the shielding layer 142 of the color conversion unit 140. The quantum dot film 15 includes a plurality of red quantum dots 152 with red emission spectrum and a plurality of green quantum dots 153 with green emission spectrum. The quantum dot film 15 receives the blue light emitting from the OLED units 13 and converts partial of the blue light to green light and red light, and the remnant of the blue light mixes the red light and the green light to produce a white light. The red coloration unit 165, the green coloration unit 166 and the blue coloration unit 167 of the color filter layer 16 filters the white light emitting from the quantum dot film 15 to produce a red light, a green light and a blue light respectively.

In this embodiment, the OLED unit 13 emits single color light, and therefore has some advantages, such as uniformity brightness and simple driving circuit.

Furthermore, the quantum dot film 15 of the color conversion layer 14 has the advantages of good stability, long fluorescence lifetime, narrow of full width at half maximum, wide luminescence spectrum and high color saturation. Controlling the size of the quantum dot can be obtained a quantum dot with predetermined color emission spectrum. In this embodiment, the quantum dot film 15 of the OLED display panel can receive and convert the blue light, enhancing display performance.

Figure 4:
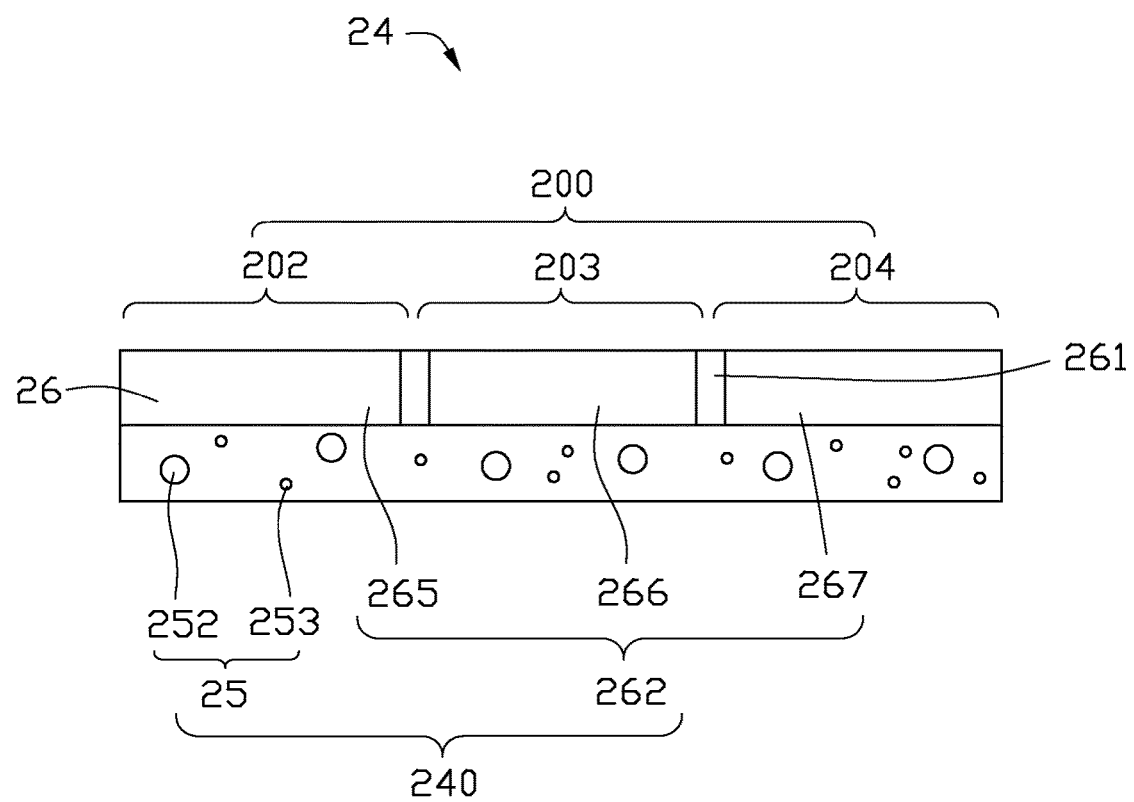
FIG. 4 is a diagrammatic view of a second embodiment of a color conversion layer of an OLED display panel.

FIG. 4 illustrates a diagrammatic view of a second embodiment of a color conversion layer 24 of an OLED display panel. The OLED display panel of the second embodiment is similar to the OLED display panel 1 of the first embodiment. The OLED display panel of the second embodiment for full-color display includes a plurality of pixels 200. Each of the plurality of pixels 200 includes a first sub-pixel 202, a second sub-pixel 203 and a third sub-pixel 204 respectively corresponding to red light, green light and blue light of the three-primary colors to emit.

The color conversion layer 24 includes a plurality of color conversion units 240, and each of the plurality of color conversion units corresponding to one of the plurality of the pixels 200. The color conversion layer 24 further includes a first black matrix 261 dividing each of the plurality of color conversion units 240 into a plurality of sub-areas, each of the plurality of sub-areas corresponds to the first sub-pixel 202, the second sub-pixel 203 and the third sub-pixel 204 respectively. Each of the plurality of color conversion units 240 includes a quantum dot film 25 and a color filter layer 26 overlapping the quantum dot film 25, the quantum dot film 15 is set closer to a substrate of the OLED display panel than the color filter layer 26.

The color filter layer 26 includes a coloration layer 262. The coloration layer 262 includes a red coloration unit 265, a green coloration unit 266 and a blue coloration unit 267, and the first black matrix 261 is configured to separate the red coloration unit 265, the green coloration unit 266 and the blue coloration unit 267. A difference between the color conversion layer 24 of the second embodiment and the color conversion layer 14 of the first embodiment is that the quantum dot film 25 doesn't include a second black matrix dividing the quantum dot film 25.

The quantum dot film 25 includes a plurality of red quantum dots 252 with red emission spectrum and a plurality of green quantum dots 253 with green emission spectrum. The quantum dot film 25 receives the blue light and converts partial of the blue light to green light and red light, and the remnant of the blue light mixes the red light and the green light to produce a white light. The red coloration unit 265, the green coloration unit 266 and the blue coloration unit 267 of the color filter layer 26 filters the white light emitting from the quantum dot film 25 to produce a red light, a green light and a blue light respectively.

Figure 5:
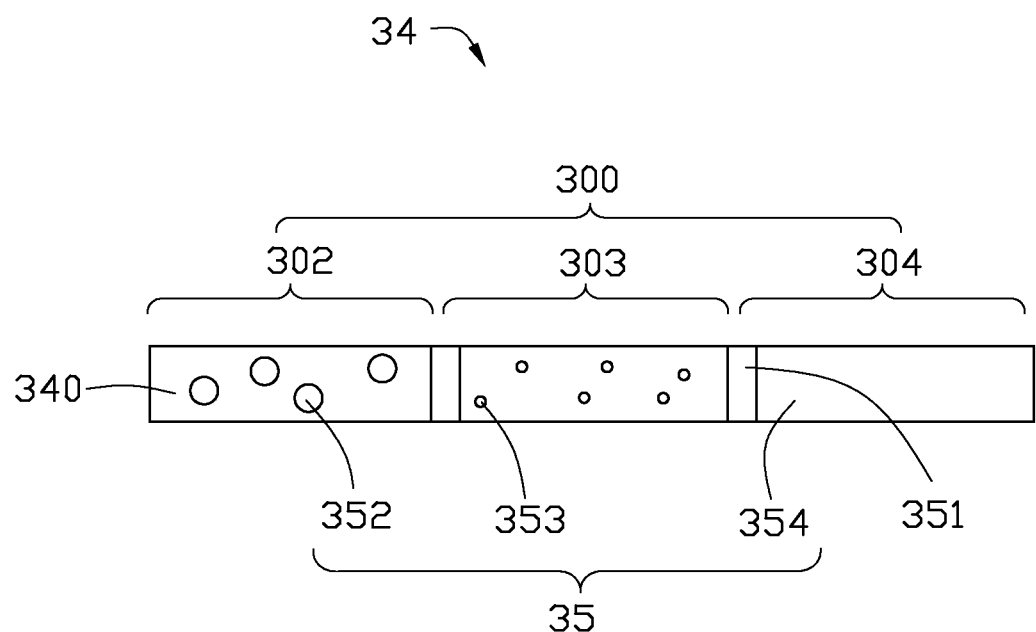
FIG. 5 is a diagrammatic view of a third embodiment of a color conversion layer of an OLED display panel.

FIG. 5 illustrates a diagrammatic view of a third embodiment of a color conversion layer 34 of an OLED display panel. The OLED display panel of the third embodiment is similar to the OLED display panel 1 of the first embodiment. The OLED display panel of the third embodiment for full-color display includes a plurality of pixels 300. Each of the plurality of pixels 300 includes a first sub-pixel 302, a second sub-pixel 303 and a third sub-pixel 304 respectively corresponding to red light, green light and blue light of the three-primary colors to emit.

The color conversion layer 34 includes a plurality of color conversion units 340, and each of the plurality of color conversion units 340 corresponding to one of the plurality of the pixels 300. Each of the plurality of color conversion units 340 is composed of a quantum dot film 35. The color conversion layer 34 further includes a second black matrix 351 dividing the quantum dot film 35 into three sub-areas corresponding to the first sub-pixel 302, the second sub-pixel 303 and the third sub-pixel 304 respectively.

The second black matrix 351 forms a shielding layer of each of the plurality of color conversion units. One of three sub-areas of the quantum dot film 35 corresponding to the first sub-pixel 302 includes a plurality of red quantum dots 352 with red emission spectrum distributing therein. The other of three sub-areas of the quantum dot film 35 corresponding to the second sub-pixel 303 includes a plurality of green quantum dots 353 with green emission spectrum distributing therein. The rest of three sub-areas of the quantum dot film 35 corresponding to the third sub-pixel 304 is a first transparent region 354. The sub-area of the quantum dot film 35 corresponding to the first sub-pixel 302 receives blue light and converts the blue light to red light to emit. The sub-area of the quantum dot film 35 corresponds to the second sub-pixel 303 receives blue light and converts the blue light to green light to emit. The sub-area of the quantum dot film 35 corresponds to the first sub-pixel 304 receives blue light and emits the blue light.

Figure 6:
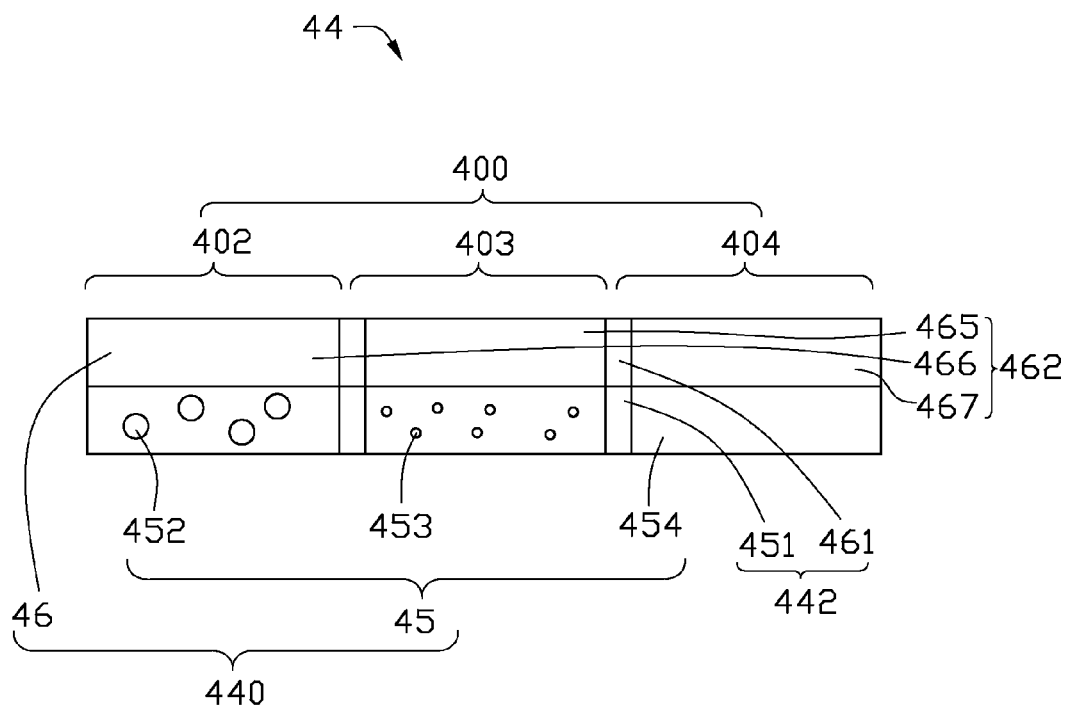
FIG. 6 is a diagrammatic view of a fourth embodiment of a color conversion layer of an OLED display panel.

FIG. 6 illustrates a diagrammatic view of a fourth embodiment of a color conversion layer of an OLED display panel. The OLED display panel of the fourth embodiment is similar to the OLED display panel 1 of the first embodiment. The OLED display panel of the fourth embodiment for full-color display includes a plurality of pixels 400. Each of the plurality of pixels 400 includes a first sub-pixel 402, a second sub-pixel 403 and a third sub-pixel 404 respectively corresponding to red light, green light and blue light of the three-primary colors to emit.

The color conversion layer 44 includes a plurality of color conversion units 440, and each of the plurality of color conversion units 440 corresponds to one of the plurality of the pixels 400. The color conversion layer 44 further includes a shielding layer 442 dividing each of the plurality of color conversion units 440 into a plurality of sub-areas, each of the plurality of sub-areas respectively corresponds to the first sub-pixel 402, the second sub-pixel 403 and the third sub-pixel 404 of the pixel 400. Each of the plurality of color conversion units 440 includes quantum dot film 45 and color filter layer 46 overlapping the quantum dot film 45, and the quantum dot film 45 is set closer to a substrate of the OLED display panel than the color filter layer 46.

The color filter layer 46 includes a coloration layer 462 and a first black matrix 461. The coloration layer 462 includes a red coloration unit 465 corresponding to the first sub-pixel 402 of the pixel 400, a green coloration unit 466 corresponding to the second sub-pixel 403 of the pixel 400 and a second transparent region 467 corresponding to the third sub-pixel 404 of the pixel 400. The first black matrix 461 is configured to separate the red coloration unit 465, the green coloration unit 466 and the second transparent region 467.

The quantum dot film 45 includes a second black matrix 451 corresponding to the first black matrix 461. The second black matrix 451 divides the quantum dot film 45 into three sub-regions corresponding to the first sub-pixel 402, the second sub-pixel 403 and the third sub-pixel 404 respectively. The first black matrix 461 and the second black matrix 451 constitute the shielding layer 442 of the color conversion unit 140. One of three sub-regions of the quantum dot film 45 corresponding to the first sub-pixel 402 includes a plurality of red quantum dots 452 with red emission spectrum distributing therein. The other three sub-regions of the quantum dot film 45 corresponding to the second sub-pixel 403 includes a plurality of green quantum dots 453 with green emission spectrum distributing therein. The rest of three sub-regions of the quantum dot film 45 corresponding to the third sub-pixel 404 is a first transparent region 454. The sub-region of the quantum dot film 45 corresponding to the first sub-pixel 402 receives blue light and converts the blue light to red light to emit. The sub-region of the quantum dot film 45 corresponding to the second sub-pixel 403 receives blue light and converts the blue light to green light to emit. The sub-region of the quantum dot film 45 corresponding to the first sub-pixel 404 receives blue light and emits the blue light.

Figure 7:
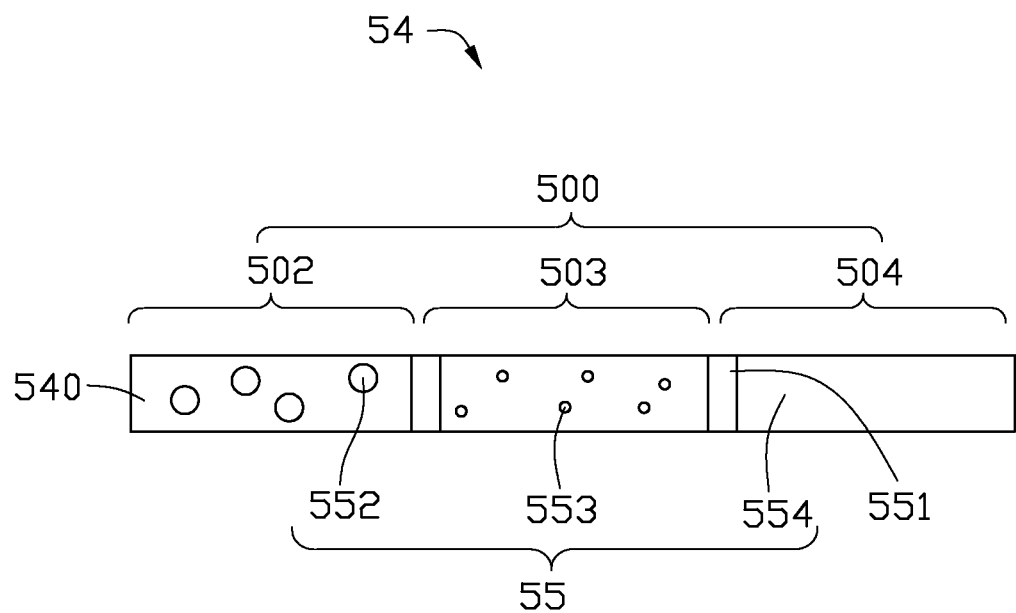
FIG. 7 is a diagrammatic view of a fifth embodiment of a color conversion layer of an OLED display panel.

FIG. 7 illustrates a diagrammatic view of a fifth embodiment of a color conversion layer 54 of an OLED display panel. The OLED display panel of the fifth embodiment is similar to the OLED display panel 1 of the first embodiment. The OLED display panel of the fifth embodiment for full-color display includes a plurality of pixels 500. Each of the plurality of pixels 500 includes a first sub-pixel 502, a second sub-pixel 503 and a third sub-pixel 504 respectively corresponding to red light, green light and blue light of the three-primary colors to emit.

The color conversion layer 54 includes a plurality of color conversion units 540, and each of the plurality of color conversion units 540 corresponds to one of the plurality of the pixels 500. Each of the plurality of color conversion units 540 is composed of a quantum dot film 55. The color conversion layer 54 further includes a second black matrix 551 dividing the quantum dot film 55 into three sub-areas corresponding to the first sub-pixel 502, the second sub-pixel 503 and the third sub-pixel 504 respectively.

The second black matrix 551 forms a shielding layer of each of the plurality of color conversion units. One of three sub-areas of the quantum dot film 55 corresponding to the first sub-pixel 502 includes a plurality of red quantum dots 552 with red emission spectrum distributing therein. The other of three sub-areas of the quantum dot film 55 corresponding to the second sub-pixel 503 includes a plurality of green quantum dots 553 with green emission spectrum distributing therein. The rest of three sub-areas of the quantum dot film 55 corresponding to the third sub-pixel 504 includes a blue coloration layer 554. The sub-area of the quantum dot film 55 corresponding to the first sub-pixel 502 receives blue light and converts the blue light to red light to emit. The sub-area of the quantum dot film 55 corresponding to the second sub-pixel 503 receives blue light and converts the blue light to green light to emit. The sub-area of the quantum dot film 55 corresponding to the first sub-pixel 504 receives blue light and emits a blue light with higher color saturation.

Figure 8:
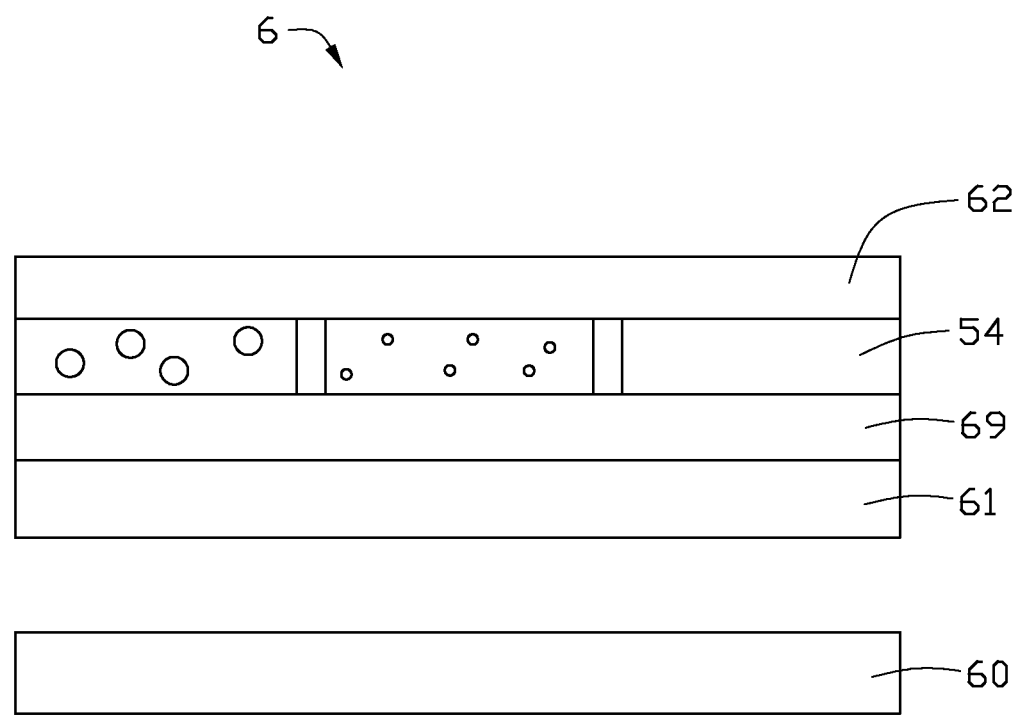
FIG. 8 is a diagrammatic view of a sixth embodiment of a liquid crystal display panel of the present disclosure.

FIG. 8 illustrates a diagrammatic view of a sixth embodiment of a liquid crystal display panel 6 of the present disclosure. The liquid crystal display 6 panel includes a first substrate 61, a second substrate 62 disposed oppositely to the first substrate 61, a liquid crystal layer 69 disposed between the first substrate 61 and the second substrate 62, a color conversion layer 54 of the fourth embodiment disposed between the liquid crystal layer 69 and the second substrate 62. The color conversion layer 54 of the liquid crystal display panel 6 replaces conventional color filter of a liquid crystal panel and may be one the color conversion layers of the first embodiment to fourth embodiment. In this embodiment, the color conversion layer 54 of the liquid crystal display panel 6 receives the blue planar light of the backlight 60 and converts the blue planar light to red light, green light and blue light of three-primary colors to emit.

The embodiments shown and described above are only examples. Many details are often found in the art such as the other features of an OLED display panel. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A color conversion layer, comprising
a plurality of color conversion units, wherein each of the plurality of color conversion units comprises a quantum dot film and a color filter layer overlapping the quantum dot film: each of the plurality of color conversion units is divided into a plurality of sub-areas; the color filter layer is configured to filter the light emitting from the quantum dot film to produce three-primary colors; the plurality of color conversion units receive a monochromatic light and convert the monochromatic light to at least one of three-primary colors to emit, wherein each of the plurality of sub-areas corresponds to the at least one of three-primary colors.

2. The color conversion layer of claim 1, further comprising a plurality of shielding layers, and each of the plurality of shielding layers is between two adjacent sub-areas.

3. The color conversion layer of claim 2, wherein the monochromatic light is blue light, the quantum dot film receives the blue light and converts the blue light to white light for emission, and the color filter layer filters the white light emitting from the quantum dot film to produce one of the three-primary colors.

4. The color conversion layer of claim 3, wherein the quantum dot film comprises a plurality of red quantum dots with red emission spectrum and a plurality of green quantum dots with green emission spectrum, the quantum dot film converts part of the blue light to green light and red light, and the green light and the red light mix with remnants of the blue light to produce white light.

5. The color conversion layer of claim 4, wherein the color filter layer comprises a coloration layer and a plurality of first black matrixes, the coloration layer comprises a red coloration unit, a green coloration unit, and a blue coloration unit, and the plurality of first black matrixes are configured to separate each of the coloration units.

6. The color conversion layer of claim 5, wherein each of the plurality of shielding layers of the color conversion layer comprises the plurality of first black matrixes.

7. The color conversion layer of claim 5, wherein the quantum dot film further comprises a plurality of second black matrixes corresponding to the plurality of first black matrixes, the plurality of second black matrixes divides the quantum dot film into the plurality of sub-regions, and the plurality of first black matrixes and the plurality of second black matrixes form the plurality of shielding layers of the plurality of color conversion units.

8. The color conversion layer of claim 2, wherein the plurality of shielding layers comprise a plurality of first black matrixes and a plurality of second black matrixes; and the monochromatic light is blue light, the quantum dot film comprises the plurality of second black matrixes forming the plurality of shielding layers of the plurality of color conversion units, the plurality of second black matrixes divide the quantum dot film into a first sub-region, a second sub-region, and a third sub-region, the first sub-region of the quantum dot film comprises a plurality of red quantum dots with red emission spectrum, the second sub-region of the quantum dot film comprises a plurality of green quantum dots with green emission spectrum, the third sub-region of the quantum dot film comprises a transparent matter, the first sub-region of the quantum dot film receives the blue light and converts the blue light to red light for emission, the second sub-region of the quantum dot film receives the blue light and converts the blue light to green light for emission, and the blue light penetrates the third sub-region of the quantum dot film to emit.

9. The color conversion layer of claim 8, wherein the color filter layer comprises a coloration layer and the plurality of first black matrixes, the coloration layer comprises a red coloration unit corresponding to the first sub-region of the quantum dot film, a green coloration unit corresponding to the second sub-region of the quantum dot film, and a transparent coloration unit corresponding to the third sub-region of the quantum dot film, and each of the plurality of the first black matrixes separates the red coloration unit, the green coloration unit, and the transparent coloration unit.

10. A display device, comprising:
a plurality of pixels, wherein each of the plurality of the pixels comprises a first sub-pixel, a second sub-pixel and a third sub-pixel emitting different color light respectively;
a substrate;
a plurality of scanning lines parallelly disposed on the substrate;
a plurality of data lines parallelly disposed on the substrate and insulately crossing the plurality of scanning lines to define the first sub-pixel, the second sub-pixel and the third sub-pixel respectively;
a plurality of first electrodes, wherein each of the plurality of first electrodes corresponding to the first sub-pixel, the second sub-pixel and the third sub-pixel respectively;
an organic light-emitting layer;
a second electrode, wherein each of the plurality of first electrodes, the organic light-emitting layer and the second electrode define an OLED unit; and
a color conversion layer comprising a plurality of color conversion units, wherein each of the plurality of color conversion units comprises a quantum dot film and a color filter layer overlapping the quantum dot film, and corresponds to one of the plurality of pixels, the plurality of color conversion units receives a monochromatic light and converts the monochromatic light to at least one of three-primary colors for emission,
wherein each of the plurality of color conversion units comprises a plurality of sub-areas, each of the plurality of sub-areas corresponds to the at least one of three-primary colors, and each of the plurality of sub-areas corresponds to the first sub-pixel, the second sub-pixel and the third sub-pixel respectively.

11. The display device of claim 10, wherein the color conversion layer is disposed on the second electrode away from the plurality of first electrodes.

12. The display device of claim 10, wherein the color conversion layer is disposed between the plurality of first electrodes and the second electrode.

13. The display device of claim 12, wherein the OLED unit comprises at least one of a hole injection layer and a hole transporting layer disposed between the plurality of first electrodes and the organic light-emitting layer.

14. The display device of claim 12, wherein the OLED unit further comprises at least one of an electron injection layer and an electron transporting layer disposed between the second electrode and the organic light-emitting layer, the color conversion layer disposed between any two layers of the plurality of first electrodes, a hole injection layer, a hole transporting layer, the organic light-emitting layer, the electron transporting layer, the electron injection layer and the second electrode.

15. A display device, comprising:
a first substrate;
a second substrate opposite to the first substrate; and
a color conversion layer disposed between the first substrate and the second substrate,
wherein the color conversion layer comprises a plurality of color conversion units, each of the plurality of color conversion units comprises a quantum dot film and a color filter layer overlapping the quantum dot film: each of the plurality of color conversion units divides into a plurality of sub-areas, the color filter layer is configured to filter the light emitting from the quantum dot film to produce three-primary colors;
the plurality of color conversion units receive a monochromatic light and convert the monochromatic light to at least one of three-primary colors for emission, and each of the plurality of sub-areas corresponds to the at least one of three-primary colors.

16. The display device of claim 15, wherein the quantum dot film comprises a plurality of red quantum dots with red emission spectrum and a plurality of green quantum dots with green emission spectrum, the quantum dot film converts parts of blue light to green light and red light, and the green light and the red light mix with remnants of the blue light to produce white light.

17. The display device of claim 15, further comprising a liquid crystal layer sandwiched between the first substrate and the second substrate, the color conversion layer disposed between the second substrate and the liquid crystal layer.

18. The display device of claim 15, further comprising a plurality of shielding layers dividing the plurality of color conversion units into the plurality of sub-areas.

19. The display device of claim 15, wherein the monochromatic light is blue light, the quantum dot film receives the blue light and converts the blue light to white light for emission, and the color filter layer filters the white light emitting from the quantum dot film to produce one of the three-primary colors.

20. The display device of claim 19, wherein the color filter layer comprises a coloration layer and a plurality of first black matrixes, the coloration layer comprises a red coloration unit, a green coloration unit and a blue coloration unit, and the plurality of first black matrixes are configured to divide the coloration layer into the coloration units.

* * * * *